United States Patent
Boluki et al.

(10) Patent No.: US 6,898,770 B2
(45) Date of Patent: May 24, 2005

(54) SPLIT AND MERGE DESIGN FLOW CONCEPT FOR FAST TURNAROUND TIME OF CIRCUIT LAYOUT DESIGN

(75) Inventors: Human Boluki, Munich (DE); Benjamin Mbouombouo, San Jose, CA (US); Johann Leyrer, Munich (DE)

(73) Assignee: LSI Logic Corporation, Milpitas, CA (US)

(*) Notice: Subject to any disclaimer, the term of this patent is extended or adjusted under 35 U.S.C. 154(b) by 173 days.

(21) Appl. No.: 10/339,821

(22) Filed: Jan. 9, 2003

(65) Prior Publication Data

US 2004/0139408 A1 Jul. 15, 2004

(51) Int. Cl.$^7$ .............................................. G06F 17/50
(52) U.S. Cl. ................. 716/6; 716/2; 716/5; 716/9; 716/14
(58) Field of Search .................. 716/2, 5, 6, 9, 716/14; 703/14

(56) References Cited

U.S. PATENT DOCUMENTS 6,701,289 B1 * 3/2004 Garnett et al. ................ 703/14

* cited by examiner

Primary Examiner—Thuan Do
(74) Attorney, Agent, or Firm—Sawyer Law Group

(57) ABSTRACT

A method and system is disclosed to improve the turnaround time to provide adequate time to meet project schedules in the event that adjustments or modifications to the design are necessary. A method for improving a turnaround time for design verification of a process database representing a semiconductor design includes the steps of (a) deriving a timing database and a (DNE) database from the process database; (b) performing, using the timing database, one or more design changes and one or more timing verifications and corrections to generate a modified timing database; (c) initiating, using the process database, physical validation of the semiconductor design prior to completion of step (b) to generate a modified DNE database; (d) merging the modified timing database with the modified DNE database to form a modified process database; and (e) performing, using the modified process database, one or more design verification checks of the semiconductor design.

15 Claims, 2 Drawing Sheets

US 6,898,770 B2

SPLIT AND MERGE DESIGN FLOW CONCEPT FOR FAST TURNAROUND TIME OF CIRCUIT LAYOUT DESIGN

FIELD OF THE INVENTION

The present invention relates generally to manufacturing techniques for the design and development of mask-produced devices, and more specifically to improving a turnaround time between layout and final approval of a device specification (e.g., a GDS2 database).

BACKGROUND OF THE INVENTION

The design, layout, test and manufacture of devices produced using masking processes like photolithography are very well known. For example, U.S. Pat. No. 6,171,731 (the '731 patent) issued to Medvedeva, et. al. entitled "Hybrid Aerial Image Simulation" provides a background for semiconductor fabrication. The specification of the '731 patent is hereby incorporated herein as though set forth in full by this reference.

The classical approach to design an Application Specific Integrated Circuit (ASIC) either in a fixed monolithic semiconductor technology such as gate arrays (GA) or standard cells (SC) or in a programmable technology like Field Programmable Gate Arrays (FPGAs) is divided into several phases. FIG. 1 is a conventional design cycle model 100 that forms a framework within which steps subsequent to a design specification step 105 may be meaningfully integrated to produce a functional, reliable product. After design specification step 105, there are four major phases in design model 105, namely a high level synthesis step 110, a logic synthesis step 115, a layout synthesis step 120 and a manufacturing step 125.

Design specification step 105 usually begins with or is initiated from a product requirement, which results from interaction between marketing and prospective costumers. An engineering response to the proposed product usually takes the form of a product definition document, which addresses issues of feasibility, general methods or techniques, cost, technical risk, trade offs between different approaches, and similar items necessary to get product developments approvals. A general design specification evolves into a precise technical description, where focus is on the external behavior of the circuits and communications between the circuit and its external environment rather than an internal realization.

Following design specification step 105 is high level synthesis step 110. A main objective of high level synthesis step 110 is to begin with the circuit specification details, transforming them into a high-level description of how the various circuits will be structured, what major functions need to be accomplished within the circuit and how these functions can be realized as an interconnection of smaller circuit constituents to meet the circuit specification details. High level synthesis step 110 takes an abstract behavioral representation of a digital system and produces a register-transfer level (RTL) structure that realizes a given behavior. At this point in design model 100, each functional block is defined in terms of interconnected registers, multiplexers, control elements, and the like. This is usually a critical phase in the evolution of the circuit design, for the designer must ensure that the behavioral description being produced matches both performance and functional specifications. Describing a complex digital system with hundreds of thousands of gates at the gate level is an extremely challenging task, and therefore, high level synthesis tools were introduced. The VHSIC (very high speed integrated circuit) Hardware Description Language, known as VHDL was adopted as an industry standard in about 1987 and is often used to describe hardware from the abstract behavioral to the concrete level. VHDL was defined because a need existed for an integrated design and documentation language to communicate design data between various levels of abstractions.

Following high level synthesis step 110 is logic synthesis step 115. Synthesis step 115 includes two subparts, an optimization step 115a and a verification step 115b, with optimization 115 usually beginning with the RTL description and a collection of logic primitives. The primitives are usually determined by a selected implementation style, and may be a collection of available gates, flip-flops, control functions, etc. Each functional block described in a behavioral design phase is transferred into a description that consists of logic primitives. They are interconnected in a manner that satisfies both functional and performance portions of the circuit specification. Logic synthesis step 115 often begins with a straightforward transformation of the RTL description into an equivalent structure, expressed in terms of logic primitives. A main objective of logic synthesis tools is to transform RTL description into an equivalent structure of logic primitives, such that either size and/or performance (e.g., critical delay) is minimized. Simulation verification step 115b confirms the optimizations and generates testing protocols for the product design.

Following logic synthesis step 115 is layout synthesis step 120. Synthesis step 120 traditionally consists of two major steps, namely placement and routing. In a placement phase, logic primitives are assigned to physical location in the carrier environment selected for realization of the circuit, with the objective being to ease interconnection wiring design. Typically, placement algorithms attempt to minimize the total expected length of interconnect required for the resulting placement. In some design styles, such as for example gate arrays, other important issues must also be considered during the placement phase. For example, in FPGAs limited routing resources, routing channel congestion and routing delays must also be considered during the placement phase. In a routing phase, placed logic primitives are interconnected to form a desired logic design. Routing algorithms need not only ensure a one hundred percent routable design, but also to minimize routing congestions and a required routing space, as well as routing delays (timing), that are imposed with the parasitic effects on routing resources. After routing and timing, the design is verified by numerous design checks referred to as physical verification.

After layout synthesis step 120, fabrication in manufacturing step 125 depends on several things including a selected technology and design style. For a semi-custom design style such as standard cells and gate array, masks are created in a technology center from a GDS2 database. If the product is implemented in a programmable device, the devices are programmed in manufacturing step 125.

The last part of layout synthesis step 120 is the physical verification before sending the GDS2 database to a mask vendor. Physical verification includes design rule checking and layout versus schematic checks. Once physical verification starts, a turnaround time for completing the verification for multimillion gate ASIC designs is very high. This turnaround time frequently becomes a bottle-neck in design flow model 100.

In the timing closure part of the layout synthesis step 120, prior to the physical verification, engineering changes are applied to the design to reach desirable performance and timing requirements. The product design parameters are maintained in a database, and the database is locked during the timing closure process. The DRC/LVS checking does not begin until the database is unlocked following completion of the routing and timing. Serious problems could occur in model 100 if DRC/LVS started prior to completing the routing and timing. These serious problems would arise due to mistakes in the physical implementation that would be discovered very late in the design process. Discovering a serious problem late in the design process is likely to have a significant adverse impact on the overall project schedule.

As the projects become more and more complex, conventional model 100 can further make a project schedule unpredictable because the number of DRC/LVS violations that must be corrected after layout is completed grows to unmanageable size. For example, it is typical that a post-timing layout database includes over 80,000 DRC/LVS violations. Management is unable to predict when all of the tests will be conducted with attendant violations cleared. The necessary and considerable resources for initiating these tests and clearing any violations cannot be applied until late in the process. Thus turnaround time is unpredictable and typically is very long.

It is therefore desirable to improve the turnaround time to provide adequate time to meet project schedules in the event that adjustments or modifications to the design are necessary.

SUMMARY OF THE INVENTION

A method and system is disclosed to improve the turnaround time to provide adequate time to meet project schedules in the event that adjustments or modifications to the design are necessary. A method for improving a turnaround time for design verification of a process database representing a semiconductor design includes the steps of (a) deriving a timing database and a (DNE) database from the process database; (b) performing, using the timing database, one or more design changes and one or more timing verifications and corrections to generate a modified timing database; (c) initiating, using the process database, physical validation of the semiconductor design prior to completion of step (b) to generate a modified DNE database; (d) merging the modified timing database with the modified DNE database to form a modified process database; and (e) performing, using the modified process database, one or more design verification checks of the semiconductor design.

Splitting the database into a physical database and a timing database and processing both databases concurrently (one for routing and timing and the other for physical verification) improves the turnaround time of the design model employing this invention over conventional models. Changes made during timing verification are merged into the physical database, and the physical verification is completed to make the physical verification accurate.

DETAILED DESCRIPTION OF THE INVENTION

The present invention relates generally to manufacturing techniques for the design and development of mask-produced devices, and more specifically to improving a turnaround time between layout and final approval of a device specification (e.g., a GDS2 database). The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 2:
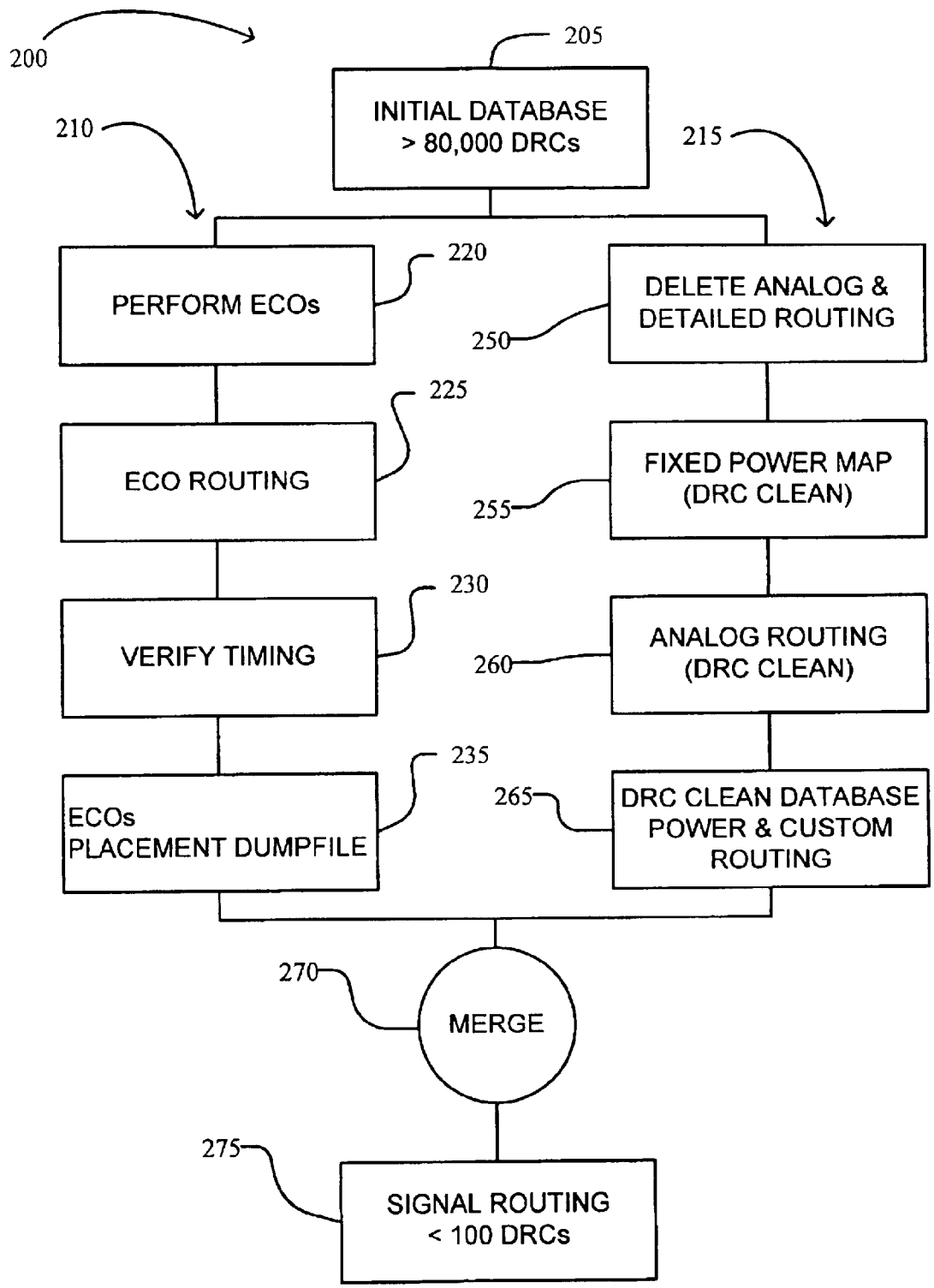
FIG. 2 is a preferred embodiment of a portion of a design cycle model that improves turnaround time.

FIG. 2 is a preferred embodiment of a portion of a design cycle model 200 that improves turnaround time. Design cycle model 200 separates a layout database 205 into two database flows: a timing database flow 210 and a physical database flow 215. Layout database 205 (as well as databases created for the timing flow 210 and the physical flow 215) is a database used by layout tools and includes all layout and timing data for the product.

Figure 1:
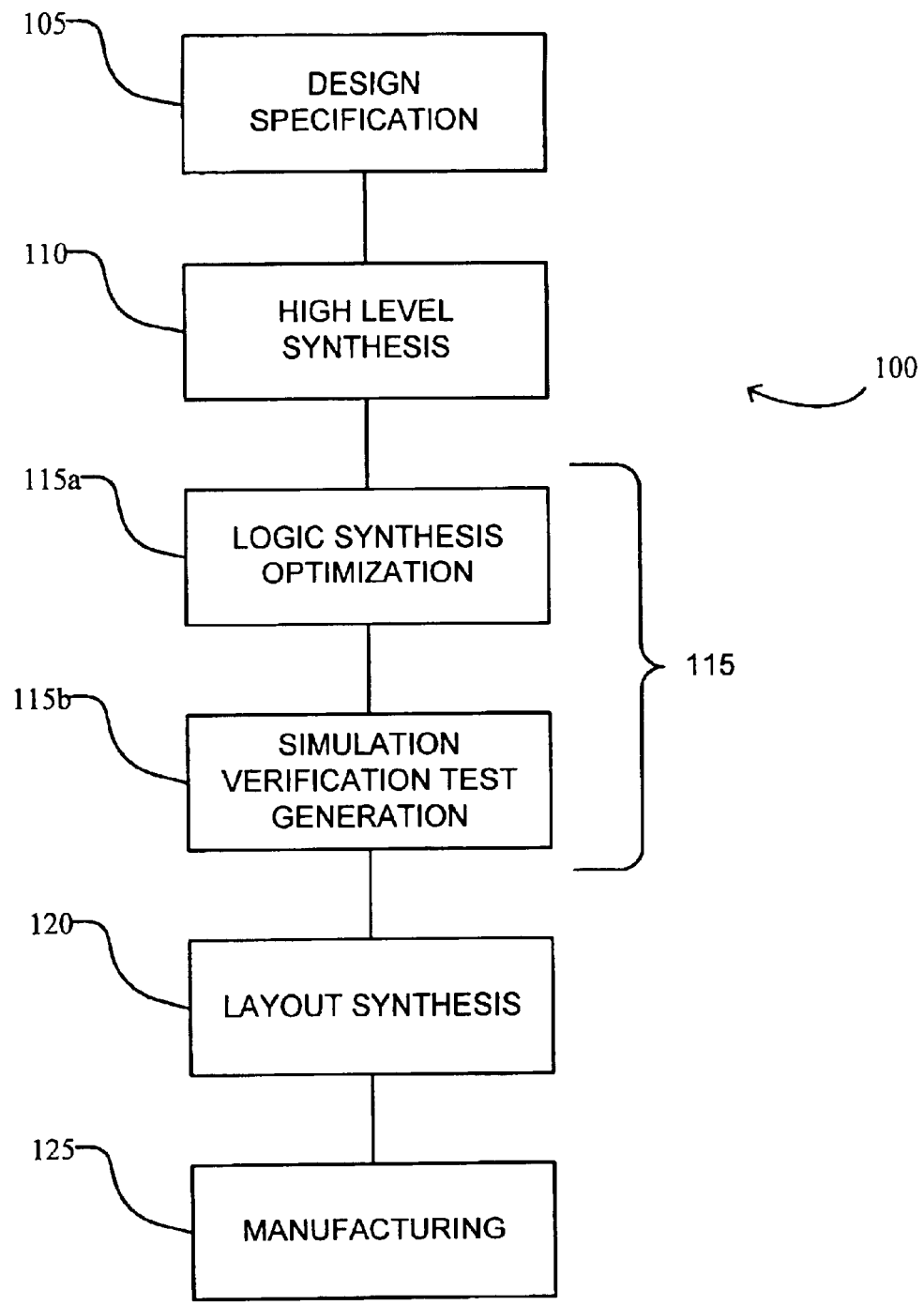
FIG. 1 is a design cycle model that forms a framework within which subsequent steps in a design flow may be meaningfully integrated to produce a functional, reliable product.

Layout synthesis step 120 shown in FIG. 1 may be further divided into the following back end flow and tapeout flows.

The Back End Flow:
1. Loading in the initial design data (library information, Verilog netlist, and synthesis constraints).
2. Initial die size estimation and automatic floorplan creation.
3. I/O placement.
4. Automatic timing driven placement of block macros.
5. Initial power routing (final power routing is done later).
6. Timing driven placement and concurrent placement based optimization through gate resizing and buffer insertion/deletion for the standard cells.
7. Clock tree synthesis and placement.
8. Inserting Filler cells.
9. Routing the design (final power routing, clock routing and signal routing).
10. Extracting parasitic capacitances.
11. Post clock tree path optimization through gate resizing and buffer insertion using parasitics.
12. Incremental final routing to repair optimized nets.
13. Post Routing Timing Analysis.
14. Verification—connectivity and geometry.
15. Output of final Verilog, DEF, SDF and GDSII.
16. The GDSII from above is streamed in to the ICFB and after generating all views for the same, the design is again streamed out.

The Tapeout Flow:
1. Running DRC (Design Rule Checks) on the GDSII.
2. Running LVS (Layout Versus Schematic) on the GDSII.
3. Layer Generation (LAYGEN) on the GDSII.
4. Doing LDDCHECK (Layer Density Checks) on the design GDSII.
5. Converting the dimensions of the design from CMOSX to CMOS8.
6. Any physical changes to the design means the LVS and DRC checks needs to be done again.

The preferred embodiment divides layout database 205 after step 7 (clock synthesis and placement) of the backend flow has been completed. (In some applications the separation may be able to be accomplished earlier in the back end flow, and in some instances the separation may occur later.) As discussed above, layout database 205 is processed by two flows, timing flow 210 and physical verification flow 215. Each flow uses a copy of the original layout database 205 with each flow locking its database against any changes from outside its flow. In some applications, these databases may not be duplicates of each other. The database used for the timing flow need only contain information used by that process and the database for the physical verification need only contain information used by that process. The database copy used for timing process 210 is referred to as the timing database and the database copy used for the physical verification process 215 is referred to as the DNE database (DRC, Netlist versus schematic, and Ebeam). For the preferred embodiment, a GDS2 format is a format generated from a layout tool database (for example Avanti's Milkyway database). Any necessary modifications are done inside the layout tool and not directly in the GDS2 database. The DNE and Timing databases exist in the layout tool database. GDS2 is streamed out of the tool for DRC and LVS checks, but the corrections are done in the layout database.

Timing database flow 210 proceeds along the backend flow using the timing database while physical database flow 215 immediately starts the tapeout flow process described above using the DNE database. Timing database flow 210 applies engineering change orders (ECOs) (step 220), performs ECO routing (step 225), generates timing (step 230) and completes the layout (step 235) producing a list of changes and a final placement dumpfile. The ECOs include information about new added standard cells and their connection to other cells in the design.

Physical database flow 215 deletes analog and detailed routing (step 250), fixes power map (step 255), performs analog routing (step 260) and produces a design rule check (DRC) clean physical database with power and custom routing complete (step 265). The DNE database has been cleaned from DRC and LVS issues related to the power mesh and custom routing in the design. Netlist and placement information changes from the timing process 215 are easier backfilled into the DNE database.

Thereafter, model 200 merges the results of the timing database flow 210 into the DRC clean database from physical database flow 215 (step 270) into a modified layout database. This merger adds changes (ECOs for placement and netlist modifications for example) made to the timing database and backfills them into the verified DNE database. The unknown part of the physical verification is verification of the signal routing changes. Therefore a subpart of the DRC/LVS physical verification is rerun on the modified layout database (step 275) to complete the tapeout process. Routers used for signal routing follow deterministic algorithms and there is no risk of changes in the timing of the design after the signal routing DRC/LVS physical verification.

In this approach only the information from the timing database are merged in to the DNE database. This information includes the ECOs which are basically changes applied to the logical netlist and the placement of the cells (including new added cells during the ECO). During merging the old cell placement from the DNE database is purged and overwritten with the new cell placement information and the respective logical information in the netlist (ECO). Merging the DNE database in to the timing database is not preferred, since the power routing that has been fixed on the DNE database can cause shorts or DRC violations with the routes in the timing database.

As shown in FIG. 2, process 200 drastically reduces the number of end-of-schedule DRC tests, and any attendant violations that need to be cleared. In the conventional model 100, the initial layout database can have in excess of 80,000 DRC/LVS violations that must be checked. By starting physical verification after the timing processes have been completed in the previous conventional model, the tests must be initiated and any violations cleared in a limited period. The present invention is able to detect and remove/clear most of the violations while the timing database is locked for changes so that the modified layout database may have on the order of a hundred or less DRC/LVS violations evaluated in the same period as was previously allocated for clearing over 80,000 DRC/LVS violations. This greatly reduced number of violations makes the period for finding and fixing the violations predictable. In the meantime, design timing is closed without having an additional impact on the overall turnaround time. Predictability of project schedules and allowing parallel work in complex ASIC projects are key points to project success and customer satisfaction.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for improving a turnaround time for design verification of a process database representing a semiconductor design, comprising:

(a) deriving a timing database and a physical verification database from the process database, each containing a power mesh description for the semiconductor device, a custom routing description for the semiconductor device and standard cell power routine description for the semiconductor device;

(b) performing, using the timing database, one or more design changes and one or more timing verifications and corrections to generate a modified timing database by (b1) deleting the custom routing description, (b2) fixing the vower mesh description to pass verification, and (b3) adding a new custom routing description to pass verification;

(c) initiating, using the process database, physical validation of the semiconductor design prior to completion of step (b) to generate a modified physical verification database;

(d) merging the modified timing database with the modified physical verification database to form a modified process database; and (e) performing, using the modified process database, one or more design verification checks of the semiconductor design.

2. The method of claim 1 wherein the process database and the modified process database are in a layout tool format.

3. The method of claim 1 wherein the timing database and the process database are each a copy of the process database.

4. The method of claim 1 wherein deriving (a) is performed after the process database includes clock tree placement and synthesis.

5. The method of claim 1 wherein performing (b) completes Engineering Change Orders (ECOs), implements ECO routing, and generates a timing description of the semiconductor device.

6. The method of claim 5 wherein merging (d) further comprises backfilling modifications to the timing database into the physical verification database upon completion of performing (b).

7. The method of claim 6 wherein performing (b) further comprises deleting the custom routing description, fixing the power mesh description to pass verification and adding a new custom routing description to pass verification.

8. The method of claim 7 wherein performing (e) further comprises verifying signal routing.

9. The method of claim 6 wherein performing (e) further comprises verifying signal routing.

10. The method of claim 5 wherein performing (b) further comprises deleting the custom routing description, fixing the power mesh description to pass verification and adding a new custom routing description to pass verification.

11. The method of claim 10 wherein performing (e) further comprises verifying signal routing.

12. The method of claim 5 wherein performing (e) further comprises verifying signal routing.

13. The method of claim 1 wherein performing (e) further comprises verifying signal routing.

14. The method of claim 1 wherein performing (e) further comprises verifying signal routing.

15. A system for improving a turnaround time for design verification of a process database representing a semiconductor design, comprising:

means for deriving a timing database and a physical verification database from the process database, each containing a power mesh description for the semiconductor device, a custom routing description for the semiconductor device and standard cell power routing description for the semiconductor device;

means for performing, using the timing database, one or more design changes and one or more timing verifications and corrections to generate a modified timing database, and for deleting the custom routing description, fixing the power mesh description to pass verification, and adding a new custom routing description to pass verification;

means for initiating, using the process database, physical validation of the semiconductor design prior to completion of the design change and timing verification to generate a modified physical verification database;

means for merging the modified timing database with the modified physical verification database to form a modified process database; and means for performing, using the modified process database, one or more design verification checks of the semiconductor design.

* * * * *